United States Patent [19]

Usry

[11] 4,097,852
[45] Jun. 27, 1978

[54] FAULT DETECTOR FOR LIQUID IMMERSED INDUCTIVE APPARATUS

[75] Inventor: Gerald O. Usry, Rome, Ga.

[73] Assignee: General Electric Company, New York, N.Y.

[21] Appl. No.: 725,479

[22] Filed: Sep. 22, 1976

[51] Int. Cl.² ............................................. G08B 21/00
[52] U.S. Cl. ................................... 340/242; 73/49.2; 174/11 R; 200/83 A; 340/236
[58] Field of Search ............... 340/240, 242, 236, 244; 200/61.04, 61.25, 83 A, 83 S, 83 SA, 83 W; 73/40, 49.2, 299, 303; 174/11 R; 73/49.3

[56] References Cited

U.S. PATENT DOCUMENTS

| Re. 14,728 | 9/1919 | Huffman | 73/299 |
|---|---|---|---|
| 3,760,396 | 9/1973 | Haselton | 340/240 |

Primary Examiner—John W. Caldwell, Sr.
Assistant Examiner—Daniel Myer
Attorney, Agent, or Firm—Francis X. Doyle; Richard A. Menelly

[57] ABSTRACT

A device for detecting electrical faults internal of a liquid and gas containing power transformer. Portions of two electrically nonconducting chambers are immersed in, and each chamber has an opening into, said liquid. One of said openings permits the relatively free passage of liquid through same and the other opening contains a liquid-immersed flow-restricting orifice. A sudden change in internal transformer pressure, indicative of an internal transformer fault, creates a pressure differential between chambers because of the liquid-immersed flow-restricting orifice associated with one of said chambers and the viscous properties of said liquid. This internal failure indicating pressure differential is sensed by a suitable differential pressure sensor which, in turn, actuates power transformer fault, indicating means.

27 Claims, 5 Drawing Figures

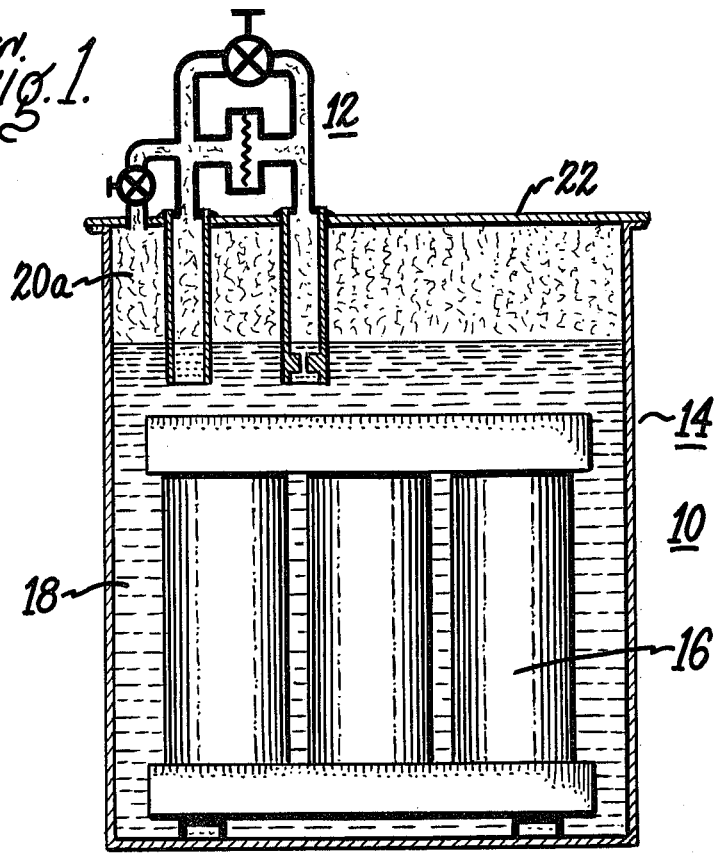
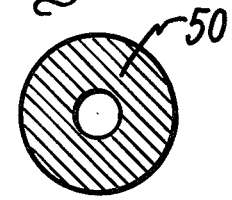
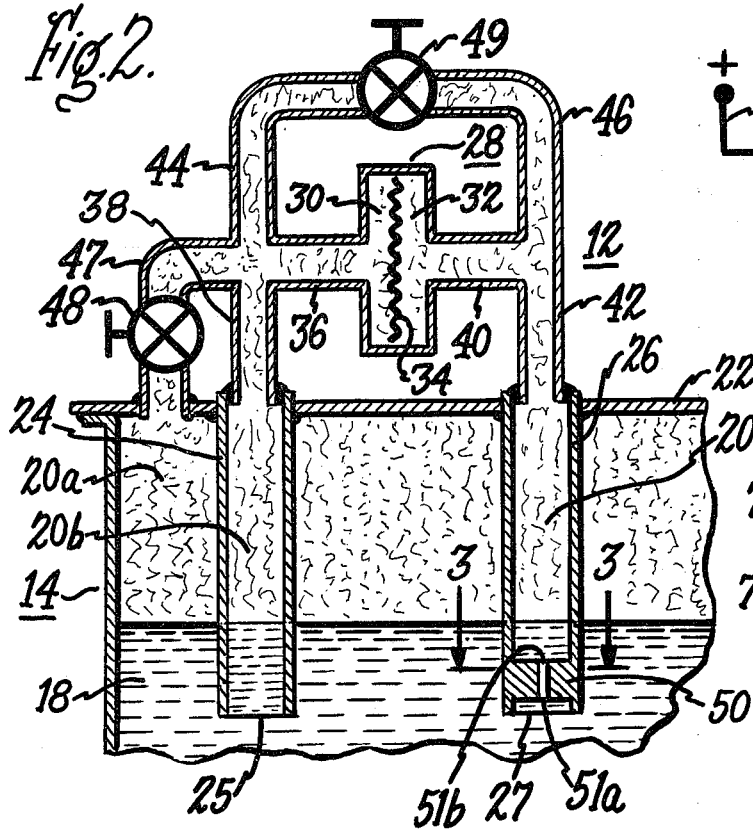
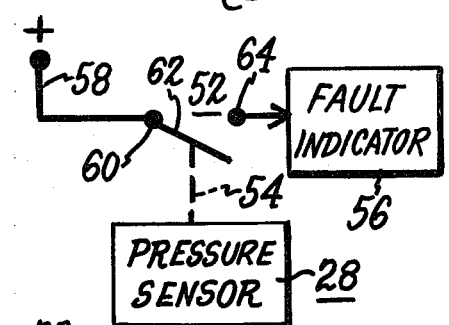
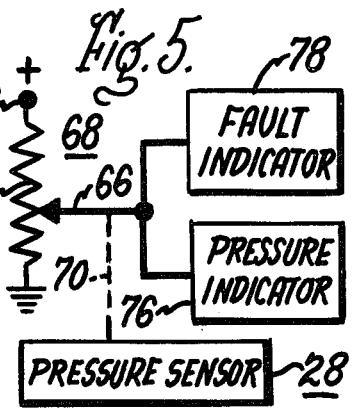

FAULT DETECTOR FOR LIQUID IMMERSED INDUCTIVE APPARATUS

BACKGROUND OF THE INVENTION

1. Field of the Invention

The present invention relates to enclosed liquid and gas containing electrical inductive apparatus in general, and to means for detecting high rates of pressure change within liquid and gas containing power transformers, in particular.

2. Description of the Prior Art

Electrical inductive apparatus of the high voltage, high power type is normally placed in an enclosure with an insulating liquid and a relatively inert gas. A power transformer is one type of inductive apparatus that is so constructed. The winding portion of the power transformer is totally immersed in the insulating liquid and the inert gas normally occupies space above the insulating liquid into which the insulating liquid may expand.

Under normal operating conditions, heat is generated by the power transformer winding and this heat increases the temperature of the insulating liquid in which the winding is immersed, causing it to expand into the gas-space above said liquid. This type of heating and consequent expansion of power transformer insulating liquid normally occurs over an extended period of time. Pressure changes occurring over relatively short periods of time almost always indicate an internal power transformer failure, such as electrical arcing between power transformer component parts. A reliable power transformer internal faults indicator can be obtained from a device that can distinguish between pressure changes that occur over short periods of time from those that occur over relatively long periods of time.

In one prior art arrangement, sudden pressure changes within a liquid and gas containing power transformer are detected by comparing the pressure in the gas of said transformer with the pressure of said gas as sensed through a flow-restricting orifice. With this arrangement the pressure at both ends of the orifice will remain the same for relatively slow changes in pressure and therefore the pressure of the gas and the pressure of the gas as sensed through said flow-restricting orifice will remain essentially the same. However, for relatively high rates of pressure change a pressure differential is created between each end of the orifice because of the inability of the presurized gas to quickly pass through said orifice. In such an arrangement the opening of the flow-restricting orifice must necessarily be small in order to reduce the flow-rate of the gas passing through same to the point where the desired pressure differential can be obtained. A disadvantage of this arrangement is that contaminants within the transformer will very often reduce the size of the orifice opening which may cause the sudden pressure sensing device to become ineffective.

An arrangement for minimizing the orifice blockage problem is described in U.S. Pat. No. 3,898,404 to MARTINCIC. In MARTINCIC pressure is sensed through an orifice consisting of a plurality of disc-shaped baffles. Each baffle has an opening therethrough which is offset from the opening in an adjacent baffle and which provides a tortuous flow-limiting path for gas passing through the orifice. Larger orifice openings, that are more difficult for contaminants to block, can be utilized with this particular orifice arrangement, because of the ability of this baffle-type orifice to create the necessary pressure differential between one end of the orifice opening and the other.

While this arrangement reduces the orifice blockage problem over a single opening, gas immersed orifice, it does so by means of an orifice that is unnecessarily complex and relatively costly to fabricate.

SUMMARY OF THE INVENTION

In accordance with the present invention, apparatus for detecting high rates of pressure change within a liquid and gas containing power transformer is disclosed. Portions of two electrically nonconducting chambers, preferably of cylindrical shape, are immersed in, and each chamber has an opening into, said liquid. One of said openings permits the relatively free passage of liquid through same and the other opening contains a liquid-immersed flow-restricting orifice. A sudden change in internal transformer pressure, indicative of an internal transformer fault, creates a pressure differential between chambers, because the suddenly pressurized liquid cannot pass into the chamber with the flow-restricting orifice as quickly as it can into the chamber without such an orifice; the orifice opening and the viscous properties of the liquid in which it is immersed combining to create the desired flow-restricting characteristics. This pressure differential is sensed by a differential pressure sensor which indicates, through suitable indicating means, that an internal power transformer fault has occurred.

BRIEF DESCRIPTION OF THE DRAWINGS

FIG. 1 is a partial sectional view, in elevation, of a power transformer incorporating the fault detector of the present invention.

FIG. 2 is an enlarged detail of the fault detector of the present invention, in elevation.

FIG. 3 is a cross-sectional view taken on the line 3—3 in FIG. 2, showing the orifice portion of the fault detector of the present invention.

FIG. 4 is a schematic diagram of a fault indicating electrical circuit that is associated with the differential pressure sensor in the fault detector of the present invention.

FIG. 5 is a schematic diagram of a fault pressure and actual pressure indicating electrical circuit that can be utilized with the differential pressure sensor in the fault detector of the present invention.

DESCRIPTION OF THE PREFERRED EMBODIMENT

Throughout the description of the preferred embodiment, parts having the same numerals in different drawing figures are to be considered the same or equivalent.

Referring now to the drawings and specifically to FIG. 1, power transformer 10 incorporating fault detector 12, of the present invention, is depicted. Power transformer 10 includes transformer tank 14 containing winding 16 which is totally immersed in insulating or dielectric liquid 18. Relatively inert gas 20a is contained within transformer tank 14 in the space immediately above insulating liquid 18. Fault detector 12 is mounted on and extends through cover 22 of transformer tank 14. Fault detector 12 can be more clearly seen and understood by referring to FIG. 2.

FIG. 2 is an enlarged detail of fault detector 12 in FIG. 1, and embodies the inventive concept of the present invention in a preferred configuration. Fault detector 12 includes a first cylindrical tube 24, which passes through cover 22 of transformer tank 14 and has end 25 of said first cylindrical tube 24 immersed in transformer insulating liquid 18. A sealing relationship exists between cover 22 of transformer tank 14 and the exterior cylindrical surface of first cylindrical tube 24. Relatively inert gas 20b is contained within said first cylindrical tube 24. Fault detector 12 also includes second cylindrical tube 26 which also passes through cover 22 of transformer tank 14 and also has an end 27 of same immersed in transformer insulating liquid 18. A sealing relationship exists between cover 22 of transformer tank 14 and the exterior cylindrical surface of second cylindrical tube 26. Relatively inert gas 20c is contained within said second cylindrical tube 26.

Differential pressure sensor 28 has two chambers, 30 and 32, which are separated from each other by diaphragm 34. Diaphragm 34 will move towards chamber 30 or chamber 32, as the case may be, in response to any pressure differential that might exist between these two chambers. Chamber 30 communicates with the interior of tube 24 through conduits 36 and 38. Chamber 32 communicates with interior of tube 26 through conduits 40 and 42. Conduits 38 and 42 communicate with each other through conduits 44, 46 and valve 49. Conduits 38 and 44 also communicate with the gas space above insulating liquid 18 through conduit 47. Manually operated valve 48 in conduit 47 alternately isolates and joins the interiors of said conduits 38 and 44 to the gas space above insulating liquid 18. Valve 49 is a manually operated valve that alternately joins and isolates the interiors of conduits 44 and 46.

Second cylindrical tube 26 includes insulating liquid 18 immersed, flow-restricting orifice 50 having ends 51a and 51b. Ordinarily orifice 50 will be totally immersed in insulating liquid 18. However, as long as one end, such as end 51a of orifice 50, is immersed in insulating liquid 18, orifice 50 and insulating liquid 18 can provide some degree of insulating liquid 18 flow restriction. A cross-sectional view of orifice 50, taken on the line 3—3 in FIG. 2 is depicted in FIG. 3.

FIG. 4 is a schematic diagram of pressure actuated switch 52, which is mechanically linked to diaphragm 34 (FIG. 2) of differential pressure sensor 28 by mechanical linkage 54, the actuation of which causes a fault indicating voltage signal to appear at fault indicator 56. A voltage source 58 supplies voltage to terminal 60 of pressure actuated switch 52. When arm 62 and terminal 64 of pressure actuated switch 52 come in contact with one another, a fault indicating voltage signal is supplied to fault indicator 56 through said switch 52 causing fault indicator 56 to indicate that an internal power transformer fault has occurred.

FIG. 5 is a schematic diagram of a fault pressure and actual pressure indicating electrical circuit that can be utilized with differential pressure sensor 28 in fault detector 12 of the present invention. Differential pressure sensor 28 is mechanically linked to arm 66 of potentiometer 68 by mechanical linkage 70. Arm 66 is moved by mechanical linkage 70 in proportion to the differential pressure that is sensed by differential pressure sensor 28. A voltage source 72 supplies voltage to resistance 74 of potentiometer 68. The magnitude of the voltage appearing at arm 66 of potentiometer 68 is proportionally related to the differential pressure that is sensed by pressure sensor 28. This voltage appears at actual pressure indicator 76 which is the device that visually displays the actual differential pressure that is sensed by differential pressure sensor 28. The voltage appearing at arm 66 of potentiometer 68 also appears at fault indicator 78. When this voltage reaches a predetermined magnitude, fault indicator 78 is actuated, indicating that an internal transformer 10 fault has occurred. The voltage level at which fault indicator 78 is actuated can be adjusted to any level that is within the range of pressure sensor 28 and potentiometer 68. Pressure indicator 76 and fault indicator 78 can be used together as depicted in FIG. 5 or, if desired, either device can be used separately.

DISCUSSION

Pressure within tubes 24 and 26 of fault detector 12 must be equalized at the outset, for proper fault detector operation. This pressure equalization is accomplished manually by opening and closing valves 48 and 49. Valves 48 and 49 need only remain open for a relatively short period of time to accomplish the necessary pressure equalization. An alternate and preferred method of gas pressure equalization is to place valves 48 and 49 in the open position while transformer 10 is being filled with insulating liquid 18. Valves 48 and 49 are closed when insulating liquid 18 filling is complete. As a result of this pressure equalization procedure, the pressure on both sides of diaphragm 34 of differential pressure sensor 28 as well as the pressure within tubes 24 and 26 and the gas space above insulating liquid 18 are made equal or, in other words, the pressure of gases 20a, 20b and 20c are made equal.

Under normal operating conditions, heat is generated by winding 16 (FIG. 1) due to power loss-creating factors that are inherent in all power transformer windings. The heat generated under such conditions increases the temperature of insulating liquid 18 (FIG. 2) surrounding said winding 16, over an extended period of time. Heated liquid 18 expands into the space above said liquid 18 as well as into tubes 24 and 26. Orifice 50 in tube 26 and the viscous properties of liquid 18 do not offer any significant resistance to liquid 18 flow into said tube 26 because of the relatively slow flow-rate resulting from slowly expanding liquid 18 and therefore the pressure within tubes 24 and 26 increases at the same rate and to the same value. Differential pressure switch 28 is not actuated under these conditions because the pressures on each side of diaphragm 34 are equal.

When a fault occurs within transformer tank 14, high rates of pressure change are associated with such a fault. This sudden change in internal transformer 10 pressure, which may be referred to as fault pressure, causes insulating liquid 18 to quickly expand into the gas space above insulating liquid 18 as well as into opening 25 of tube 24, which is of the free-flow type relative to orifice 50 in tube 26, and therefore only minimally restricts fluid flow into tube 24, thereby compressing the gas within these spaces. However, because of flow-restricting orifice 50 within second cylindrical tube 26 and the viscous properties of insulating liquid 18, said insulating liquid 18 is unable to quickly flow into tube 26. This inability of insulating liquid 18 to quickly flow into tube 26 results in minimal compression of gas 20c within tube 26 and creates a pressure differential between the pressure of inert gas 20b within tube 24 and the pressure of inert gas 20c within tube 26. This pressure differential is sensed by differential pressure sensor 28 and said sensor 28 actuates pressure actuated switch 52 to the closed position which causes a fault indicating voltage signal to appear at fault indicator 56.

Taking advantage of the viscous properties of a liquid, such as the viscous properties of insulating liquid 18, makes the use of larger orifice openings having greater blockage resistance, more practicable. In addition, a device of the instant type having a liquid immersed orifice can be made more sensitive to low level fault pressures than devices that sense gas pressure through a gas immersed orifice.

Tubes 24 and 26 may be fabricated from electrically conducting or electrically non-conducting materials. However, in a high voltage environment, the tubes must be fabricated from electrically non-conducting material to avoid creating an electrical insulation problem between transformer winding 16 and cover 22 of transformer tank 14.

The size of the opening of orifice 50 (FIG. 3) is largely determined by the viscosity of the liquid in which it is located and the rate of pressure change that is desired within the tube containing this flow-restricting orifice.

While a cylindrical tube shape is used to describe tubes 24 and 26 in the preferred embodiment of fault detector 12 described herein, any number of other shapes may be used to define the two normally isolated chambers that are defined by said tubes 24 and 26. The chamber shape described in the preferred embodiment is the one that, at the present time, is the most practicable for power transformers.

Enclosures for electrical inductive apparatus, and particularly power transformer enclosures, very often develop small gas leak-producing openings at various times throughout their useful lives. These small openings normally develop around access covers, fittings and the like. If tube 24 was not included in the preferred embodiment of the present invention, gas within the gas space above insulating liquid 18, which is normally pressurized, would leak from this gas space causing the pressure within same to fall and consequently, give an erroneous indication that an internal transformer fault had occurred. If it is possible to eliminate the just-mentioned gas leak problem then the present invention would function without utilizing tube 24, conduit 47 and valve 48. While such an arrangement may be presently utilized, it is not as reliable as the arrangement described in the preferred embodiment. With this alternate arrangement, the only fault detector openings through cover 22 of transformer tank 14 would be conduit 38 into the gas space above insulating liquid 18 and conduit 42 into tube 26. Pressure equalization would only be required between the space within tube 26 and the gas space above insulating liquid 18 and this is accomplished by opening valve 49, once the proper amount of insulating liquid 18 has been placed in tank 14, or by leaving valve 49 open during the filling operation and then closing it thereafter. With the present state of the art however, this arrangement is must less preferred over the arrangement described in the preferred embodiment.

Pressure equalizing valves 48 and 49 are depicted and described as being of the manually operable type. However, it is within the scope of the present invention to substitute non-manually operated pressure equalizing valves for said manually operated valves 48 and 49 which, if desired, may be automatically actuated at predetermined time intervals.

When a differential pressure is sensed between the interior of tube 24 and the interior of tube 26 by differential pressure sensor 28, pressure actuated switch 52 is closed and a fault indicating signal is sent to fault indicator 56 in FIG. 4 as previously described. Fault indicator 56 may be of the visual or audible type or a combination of both and may be located on, near or extremely remote from power transformer 10. This is also true for fault indicator 78 in FIG. 5.

It will be apparent to those skilled in the art from the foregoing description of the present invention in a preferred embodiment thereof that various improvements and modifications can be made in it without departing from its true scope. Accordingly, it is my intention to encompass within the scope of the appended claims the true limits and spirit of my invention.

I claim:

1. Apparatus for detecting pressure changes within an enclosure for electrical inductive apparatus containing a liquid and a gas, wherein said gas is located in a space above and is in contact with said liquid, comprising:
    (a) a first gas containing chamber having a flow restricting opening of predetermined size therein, at least one end of said first chamber, flow restricting opening being immersed in said liquid;
    (b) a second gas containing chamber having an opening therein that is of the free-flow type relative to the opening in said first chamber, said second chamber opening, being immersed in said liquid;
    (c) means for equalizing the pressure of gas contained in said first chamber, said second chamber, and said space above said liquid; and
    (d) means for determining when the pressure in one of said chambers changes with respect to the pressure in the other of said chambers.

2. Apparatus for detecting pressure changes within an enclosure for electrical inductive apparatus containing a liquid and a gas, as defined in claim 1, wherein said pressure determining means includes means for indicating when the pressure in one of said chambers reaches a predetermined value with respect to the pressure in the other of said chambers.

3. Apparatus for detecting pressure changes within an enclosure for electrical inductive apparatus containing a liquid and a gas, as defined in claim 1, wherein said pressure determining means includes means for indicating the extent to which the pressure in one chamber has changed with respect to the pressure in the other of said chambers.

4. Apparatus for detecting pressure changes within an enclosure for electrical inductive apparatus containing a liquid and a gas, as defined in claim 1, wherein said pressure determining means includes,
    (a) means for indicating the extent to which the pressure in one chamber has changed with respect to the pressure in the other of said chambers; and
    (b) means for indicating when the pressure in one of said chambers reaches a predetermined value with respect to the pressure in the other of said chambers.

5. Apparatus for detecting pressure changes within an enclosure for electrical inductive apparatus, as defined in claim 1, wherein said pressure equalization means includes means for automatically performing said pressure equalization at predetermined intervals of time.

6. Apparatus for detecting pressure changes within an enclosure for electrical inductive apparatus containing a liquid and a gas, as defined in claim 1, wherein said first and second chambers are constructed of electrically nonconducting material.

7. Apparatus for detecting pressure changes within an enclosure for electrical inductive apparatus containing a liquid and a gas, as defined in claim 1, wherein said means for detecting said pressure change is a differential pressure sensor.

8. A differential pressure sensor as defined in claim 7, wherein said sensor includes means for remotely indicating that said sensor has sensed a predetermined differential pressure.

9. Apparatus for detecting pressure changes within an enclosure for electrical inductive apparatus containing a liquid and a gas wherein said gas is located in a space above and is in contact with said liquid, comprising:
   (a) a first electrically nonconducting, gas containing tube having a flow-restricting opening of predetermined size therein, at least one end of said first tube, flow-restricting opening being immersed in said liquid;
   (b) a second electrically nonconducting gas containing tube having a relatively free-flow opening therein, said second tube opening being immersed in said liquid;
   (c) a third tube connecting the space within said first tube to the space within said second tube in a communicating relationship;
   (d) a fourth tube connecting the space within said third tube to said gas space above said liquid in a communicating relationship;
   (e) a valve positioned in said third tube to alternately isolate and connect together the spaces within said first and second tubes;
   (f) a valve positioned in said fourth tube to alternately isolate and connect together said space within said third tube and said gas space above said liquid; and
   (g) a differential pressure sensor that senses pressures within said first and second tubes to determine when the pressure within said first tube differs significantly from the pressure within said second tube.

10. Apparatus for detecting pressure changes within an enclosure for electrical inductive apparatus containing a liquid and a gas, as defined in claim 9, wherein said pressure determining means includes means for indicating when the pressure in one of said tubes reaches a predetermined value with respect to the pressure in the other of said tubes.

11. Apparatus for detecting pressure changes within an enclosure for electrical inductive apparatus containing a liquid and a gas, as defined in claim 9, wherein said pressure determining means includes means for indicating the extent to which the pressure in one of said tubes has changed with respect to the pressure in the other of said tubes.

12. Apparatus for detecting pressure changes within an enclosure for electrical inductive apparatus containing a liquid and a gas, as defined in claim 9, wherein said pressure determining means includes,
   (a) means for indicating the extent to which the pressure in one tube has changed with respect to the pressure in the other of said tubes; and
   (b) means for indicating when the pressure in one of said tubes reaches a predetermined value with respect to the pressure in the other of said tubes.

13. Apparatus for detecting pressure changes within an enclosure for electrical inductive apparatus, as defined in claim 9, wherein said pressure equalization means includes means for automatically performing said pressure equalization at predetermined time intervals.

14. Apparatus for detecting pressure changes within an enclosure for electrical inductive apparatus containing a liquid and a gas, as defined in claim 9, wherein said differential pressure sensor includes means for remotely indicating that said sensor has sensed a predetermined differential pressure.

15. Apparatus for detecting pressure changes within an enclosure for electrical inductive apparatus containing a liquid and a gas, wherein said gas is located in a space above and is in contact with said liquid, comprising:
   (a) a gas-containing chamber having a flow-restricting opening of predetermined size therein, at least one end of said flow-restricting chamber opening being immersed in said liquid;
   (b) means for equalizing the pressure of gas contained in said chamber and in said gas space above said liquid; and
   (c) means for determining when the gas pressure in said chamber changes with respect to the gas pressure in said gas space above said liquid.

16. Apparatus for detecting pressure changes within an enclosure for electrical inductive apparatus containing a liquid and a gas, as defined in claim 15, wherein said pressure determining means includes means for indicating when the pressure in one of said chambers reaches a predetermined value with respect to the pressure in the other of said chambers.

17. Apparatus for detecting pressure changes within an enclosure for electrical inductive apparatus containing a liquid and a gas, as defined in claim 15, wherein said pressure determining means includes means for indicating the extent to which the pressure in one chamber has changed with respect to the pressure in the other of said chambers.

18. Apparatus for detecting pressure changes within an enclosure for electrical inductive apparatus containing a liquid and a gas, as defined in claim 15, wherein said pressure determining means includes,
   (a) means for indicating the extent to which the pressure in one chamber has changed with respect to the pressure in the other of said chambers; and
   (b) means for indicating when the pressure in one of said chambers reaches a predetermined value with respect to the pressure in the other of said chambers.

19. Apparatus for detecting pressure changes within an enclosure for electrical inductive apparatus, as defined in claim 15, wherein said pressure equalization means includes means for automatically performing said pressure equalization at predetermined intervals of time.

20. Apparatus for detecting pressure changes within an enclosure for electrical inductive apparatus containing a liquid and a gas, as defined in claim 15, wherein said chamber is constructed of electrically nonconducting material.

21. Apparatus for detecting pressure changes within an enclosure for electrical inductive apparatus containing a liquid and a gas, as defined in claim 15, wherein said means for detecting said pressure change is a differential pressure sensor.

22. A differential pressure sensor as defined in claim 15, wherein said sensor includes means for remotely indicating that said sensor has sensed a predetermined differential pressure.

23. Apparatus for detecting pressure changes within an enclosure for electrical inductive apparatus containing a liquid and a gas wherein said gas is located in space above and is in contact with said liquid comprising:
(a) one gas-containing electrically nonconducting, tube having a flow-restricting opening of predetermined size therein, at least one end of said flow-restricting opening being immersed in said liquid;
(b) another tube connecting the space within said one tube to said gas space above said liquid in a communicating relationship;
(c) a valve positioned in said other tube to alternately isolate and connect together the spaces within said one and other tubes; and
(d) a differential pressure sensor for sensing pressures within said one tube and within said gas space above said liquid to determine when the pressure within said one tube differs significantly from the pressure within said gas space above said liquid.

24. Apparatus for detecting pressure changes within an enclosure for electrical inductive apparatus containing a liquid and a gas, as defined in claim 23, wherein said pressure determining means includes means for indicating when the pressure of the gas in said tube reaches a predetermined value with respect to the pressure in said gas space above said liquid.

25. Apparatus for detecting pressure changes within an enclosure for electrical inductive apparatus containing a liquid and a gas, as defined in claim 23, wherein said pressure determining means includes means for indicating the extent to which the pressure of the gas in said tube has changed with respect to the pressure in said gas space above said liquid.

26. Apparatus for detecting pressure changes within an enclosure for electrical inductive apparatus containing a liquid and a gas, as defined in claim 23, wherein said pressure determining means includes,
(a) means for indicating the extent to which the pressure of the gas in said tube has changed with respect to the pressure of the gas in said gas space above said liquid; and
(b) means for indicating when the pressure of the gas in said tube reaches a predetermined value with respect to the pressure of the gas in the gas space above said liquid.

27. Apparatus for detecting pressure changes within an enclosure for electrical inductive apparatus containing a liquid and a gas, as defined in claim 23, wherein said differential pressure sensor includes means for remotely indicating that said sensor has sensed a predetermined differential pressure.

* * * * *